United States Patent
Liu et al.

[19]

[11] Patent Number: 6,010,962
[45] Date of Patent: Jan. 4, 2000

[54] COPPER CHEMICAL-MECHANICAL-POLISHING (CMP) DISHING

[75] Inventors: Chung-Shi Liu, Hsin-Chu; Chung-Long Chang, Dou-Liu; Chen-Hua Yu, Hsin-Chu, all of Taiwan

[73] Assignee: Taiwan Semiconductor Manufacturing Company, Hsin-Chu, Taiwan

[21] Appl. No.: 09/249,262

[22] Filed: Feb. 12, 1999

[51] Int. Cl.$^7$ .................................................. H01L 21/441
[52] U.S. Cl. ......................... 438/687; 438/674; 438/700; 438/677
[58] Field of Search .................... 438/687, 677, 438/700, 674

[56] References Cited

U.S. PATENT DOCUMENTS

| | | | |
|---|---|---|---|
| 5,169,680 | 12/1992 | Ting et al. | 427/96 |
| 5,654,245 | 8/1997 | Allen | 438/629 |
| 5,659,201 | 8/1997 | Wollesen | 257/758 |
| 5,674,787 | 10/1997 | Zhao et al. | 437/230 |
| 5,858,877 | 1/1999 | Dennison et al. | 438/700 |
| 5,895,261 | 4/1999 | Schinella et al. | 438/586 |

FOREIGN PATENT DOCUMENTS

| | | | |
|---|---|---|---|
| 905768 | 3/1999 | European Pat. Off. | H01L 21/311 |

OTHER PUBLICATIONS

Guthrie et al., "Chemical–Mechanical Polishing to Planarize Blanket and Selective CVD Tungsten", Conference Proceedings ULSI–VII, (1992)–pp. 527–533, Materials Research Society.

*Primary Examiner*—Caridad Everhart
*Attorney, Agent, or Firm*—George O. Saile; Stephen B. Ackerman

[57] ABSTRACT

A method is disclosed for forming inlaid copper interconnects in an insulating layer without the normally expected dishing that occurs after chemical-mechanical polishing of the excess copper. This is accomplished by forming a conformal blanket barrier layer over a substrate including a composite groove/hole structure already formed in an insulating layer and then growing a copper seed layer over the barrier layer. A layer of photoresist is next deposited over the substrate filling the composite structure. The photoresist layer, seed layer and the barrier layer are then removed by chemical-mechanical polishing, leaving the seed layer and the barrier layer on the inside walls of the composite structure, however. Then the photoresist is removed from the composite structure, and replaced, in its place, with electroless plated copper, which forms a dome-like protrusion extending from the composite structure. When the substrate is subjected to chemical-mechanical polishing in order to remove the excess copper, the dome-like structure prevents the dishing of the copper metal. In a second embodiment, the seed layer and the barrier layer are chemical-mechanical polished without first depositing a photoresist layer. Copper metal is next selectively formed by electroless plating having a dome-like protrusion, which in turn is removed by chemical-mechanical polishing without the detrimental formation of dishing in the copper metal.

47 Claims, 5 Drawing Sheets

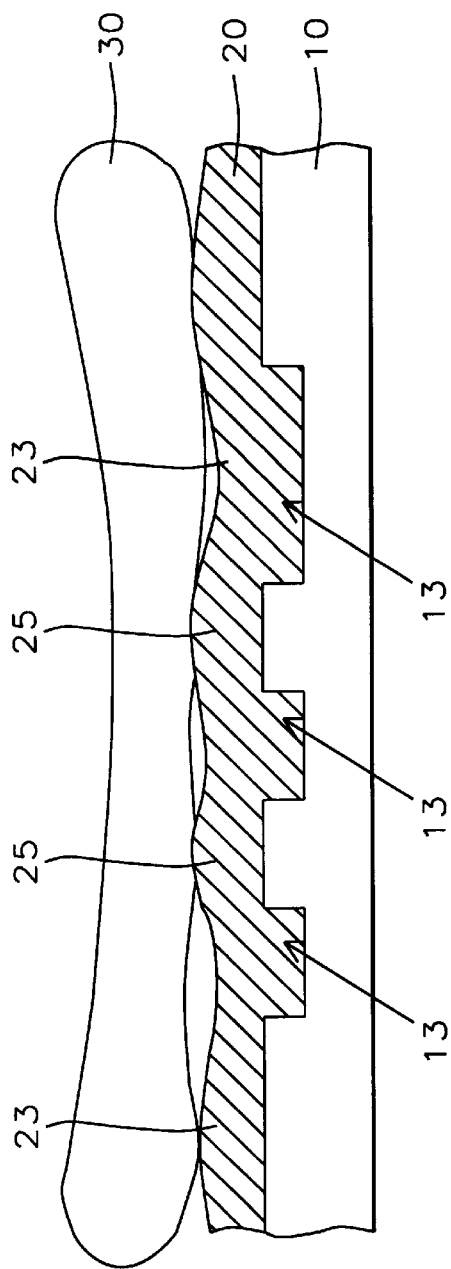
FIG. 1a – Prior Art
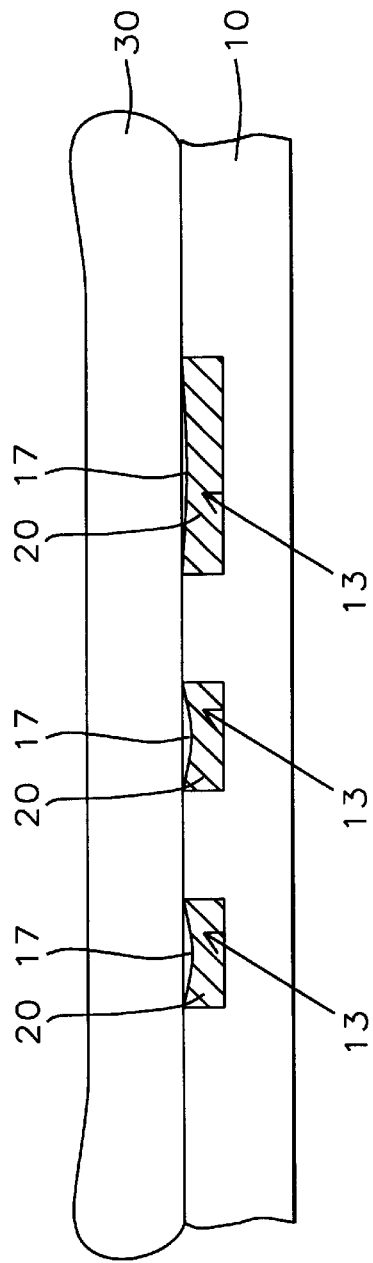
FIG. 1b – Prior Art

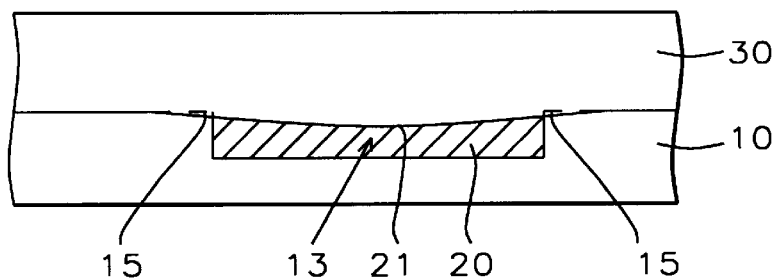
FIG. 1c – Prior Art
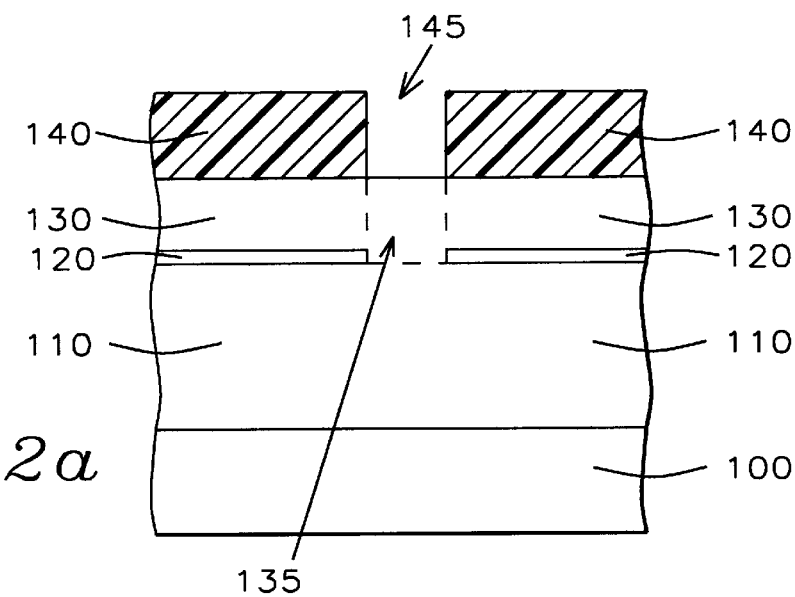
FIG. 2a
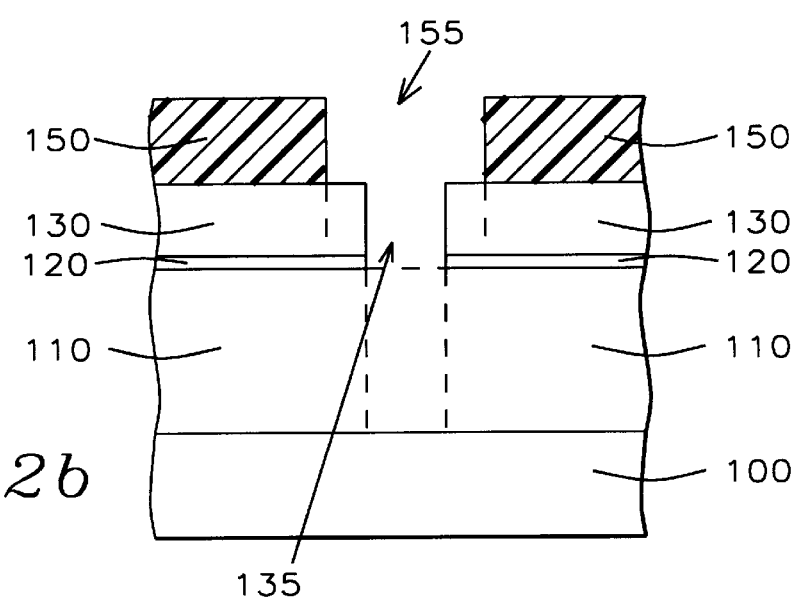
FIG. 2b

COPPER CHEMICAL-MECHANICAL-POLISHING (CMP) DISHING

BACKGROUND OF THE INVENTION

(1) Field of the Invention

The present invention relates to the manufacture of ultra large scale integrated (ULSI) circuit chips in general, and in particular, to a method of reducing the dishing that occurs during chemical-mechanical polishing (CMP) of copper metal interconnections in semiconductor substrates.

(2) Description of the Related Art

Chemical-mechanical polishing, or, CMP, is becoming an even more important process in the manufacture of ultra large scale integrated (ULSI) circuits where more devices are being packed into smaller areas in semiconductor substrates and where unconventional metals, such as copper is being used in order to improve the over-all performance of the circuits. More devices in a given area on a substrate require better planarization techniques due to the unevenness of the topography formed by the features themselves, such as metal lines, or of the topography of the layers formed over the features. Because many layers of metals and insulators are formed successively one on top of another, each layer need to be planarized to a high degree if higher resolution lithographic processes are to be used to form smaller and higher number of features on a layer in a semiconductor substrate. Conventionally, etch-back techniques are used to planarize conductive (metal) or non-conductive (insulator) surfaces. However, some important metals, such as gold, silver and copper, which have many desirable characteristics as an interconnect, are not readily amenable to etching, and hence, CMP may have to be used.

It is the nature of semiconductor physics that as the feature sizes are scaled down, the performance of internal devices in integrated circuits improves in a compounded fashion. That is, the device speed as well as the functional capability improves. The overall circuit speed, however, becomes more dependent upon the propagation speed of the signals along the interconnects that connect the various devices together. With the advent of very and ultra large scale integration (VLSI and ULSI) circuits, it has therefore become even more important that the metal conductors that form the interconnections between devices as well as between circuits in a semiconductor have low resistivities for high signal propagation. Copper is often preferred for its low resistivity, as well as for resistance to electromigration and stress voiding properties.

Conventionally, the various metal interconnect layers in a semiconductor substrate are formed separately, and serially. First, a first blanket metal is deposited on a first insulating layer and electrical lines are formed by subtractive etching of the metal through a first mask. A second insulating layer is formed over the first metallized layer, and the second insulating layer is patterned with holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new electrical lines, and the process is repeated as many times as it is needed to fabricate a semiconductor substrate.

It will be observed that patterning, that is, photolithography and etching of metal layers to form the needed interconnects constitute a significant portion of the process steps of manufacturing semiconductor substrates, and it is known that both photolithography and etching are complicated processes. Furthermore, copper is very difficult to etch. This is one of the primary reasons why the current state of very large scale integration (VLSI) employ the use of aluminum for the wiring and tungsten plugs for providing the interconnection between the different levels of wiring. However, since copper has better electromigration property and lower resistivity than aluminum, it is a more preferred material for wiring and plugs than aluminum. In addition, copper has more improved electrical properties over tungsten, making copper a desirable metal for use as plugs as well. Thus, where it was relatively easy to etch aluminum or tungsten after depositing them to form lines or via plugs, substantial additional cost and time are now required to etch copper. Accordingly, chemical-mechanical polishing has become an attractive alternative to etching in removing unwanted copper.

Another method that is especially suited to forming composite copper interconnects, that is, metal lines and plugs together, with minimal etching is the damascene process. In a single damascene process, grooves are formed in an insulating layer and filled with metal to form conductive lines. Dual damascene takes the process one step further in that, in addition to forming the grooves of a single damascene, the conductive hole openings are also formed in the insulating layer. The resulting composite structure of grooves and holes are filled with metal. The excess metal is then removed by chemical-mechanical polishing. The process is repeated as many times as required to form the multi-level interconnections between metal lines and the holes formed in between. Contact holes are formed directly over the substrate where the metal in the hole contacts the surface of the substrate, while the via holes are formed between metal layers. It will be noted that the sequence of first forming the groove in an upper insulating layer and then the hole in the underlying lower insulating layer can be reversed by forming the hole extending downwardly from the upper insulating layer to the bottom of the lower insulating layer and then "enlarging" the hole in the top layer to form the groove in the upper layer. Though each of the two approaches requires modification of some of the steps up to, but not including the last step of polishing, the details of the intermediate steps will not be given here so as to not obscure the understanding of the important step of CMP. An improvement over prior art CMP will be disclosed in the embodiments of the present invention.

As described by Guthrie, et al., in the Conference Proceedings ULSI-VII, 1992, Materials Research Society, CMP combines a chemical conversion of the surface layer to be removed with a mechanical removal of the converted layer. Ideally, the conversion product should be soft, according to Guthrie, et al., and readily removed to maintain high polishing rates. Because of the chemical nature of the conversion, rate selectivity for metal removal relative to insulator removal can be achieved by incorporating additives in the slurry to either enhance the metal removal and protect the insulator. Manipulation of the chemical component of CMP can be quite involved, while the mechanical component of the polishing mechanism can provide more straight-forward planarization characteristics.

The mechanical kinetics of CMP for a blanket deposited metal in grooves or holes in an insulator is illustrated in FIGS. 1a–1c and explained by the Preston equation given by $$(\Delta H/\Delta t) = K_p/A)(\Delta s/\Delta t), \text{ where}$$

$(\Delta H/\Delta t)$ is the removal rate of the material in terms of change in height per unit time of polishing, L is the load imposed over a surface area A, (Δs/Δt) is the relative velocity of the pad to the sample, and $K_p$ is Preston's coefficient. The equation predicts that, for a given (L/A), the weight loss of the polished material is proportional to the amount of travel, and it remains invariant with time. The polish rate increases with the pressure (L/A) and velocity. In other words, the removal rate is a linear function of pressure, so that high points are polished more rapidly, and the surface quickly becomes planar. This is shown at points (25) in FIG. 1a.

In FIG. 1a, metal (20) is deposited over an insulator (10) having groove and/or hole recesses (13) as shown. Excess metal is removed by performing mechanical polishing with pad (30) and a slurry, not shown. A slurry for removing tungsten metal, for example, may comprise the combination of two or three ingredients including: 1) a chemical base such as hydrogen peroxide ($H_2O_2$) dissolved in water, 2) an abrasive, such as alumina, silica, or titanium oxide ($TiO_x$ where x equals 1 to 2), and 3) an optional fluid such as ethylene glycol in which the abrasive is suspended. It is to be noted in passing that the Preston equation implies that the removal rate is independent of the abrasive particle size in the slurry. Once the high points are quickly polished, the relatively high pressure at the high points are diminished since the load is now shared by lower points such as (23) which are now within reach of the pad. After total removal of the metal layer (20) from the surface of insulator (10), the polishing is shared between the metal layer that is level with the insulator surface and the insulator itself. Since the polishing rate of the metal is different from that of the insulator, and in the case of copper, faster than that of the insulator, metal is removed from further below the level of the insulator, thus leaving spaces (17) as shown in FIG. 1b. This in turn causes a higher pressure being built up at the edges of the groove/hole openings (13) and (17), and therefore, erosion of the insulator edge, (15). When compounded by the elastic deformation of the polishing pad material as shown in FIG. 1c, polishing continues below the level of the insulator surface, thus causing dishing (21) of the metal surface as shown in FIG. 1c. This in turn results in defects and reliability problems which are alleviated with the proposed method of the present invention.

Some prior art methods preclude the use of CMP in order to avoid the dishing problem. In U.S. Pat. No. 5,674,787, Zhao, et al., propose using selective electroless copper deposited interconnect plugs so that the metal in holes are built up to the level of the insulator layer. Ting, et al., of U.S. Pat. No. 5,619,680 also propose electroless deposition for IC fabrication where both selective and an additive process are provided for forming conductive layers. Allen of U.S. Pat. No. 5,654,245, on the other hand, teaches selective metallization through implantation of nucleating species for copper growth in areas where interconnects are formed. Wolleson shows in U.S. Pat. No. 5,659,201 a method of forming high conductivity interconnection lines of high conductivity material, such as copper, employing barrier layers impervious to the diffusion of copper atoms.

What is needed is an improvement over prior art methods of forming copper interconnects without dishing defects through a judicious use of a modified CMP process.

SUMMARY OF THE INVENTION

It is therefore an object of the present invention to provide a method of forming copper interconnects with improved CMP dishing.

It is another object of this invention to provide a method of encasing copper interconnects in a diffusion barrier material.

It is yet another object of the present invention to provide a method of seeding the diffusion barrier material with copper.

It is still another object of the present invention to provide a method of forming copper interconnects with much reduced amenability to dishing.

These objects are accomplished by providing a semiconductor substrate having a substructure comprising devices formed in said substrate and a metal layer formed thereon; forming a lower level dielectric (LLD) layer over said substrate; forming an etch-stop layer over said LLD layer; forming an upper level dielectric (ULD) layer over said etch-stop layer; forming a first photoresist layer over said ULD layer; patterning said first photoresist layer with a hole pattern; etching through said hole pattern in said first photoresist layer into said ULD layer; etching further said hole pattern into said etch-stop layer; removing said first photoresist layer from said substrate; forming a second photoresist layer over said substrate including said hole pattern; patterning said second photoresist layer with a conductive line groove pattern; etching through said conductive line groove in said second photoresist layer into said ULD layer until etch-stop layer is reached; etching further and transferring said hole pattern from said ULD layer into said LLD layer until a lower level said substructure of said substrate is reached thus forming a composite groove/hole structure; removing said second photoresist layer; forming a barrier layer on the walls, including the bottom wall, of said composite groove/hole structure; forming a seed layer over said barrier layer; forming a third photoresist layer over said substrate including said groove/hole structure; chemical-mechanical polishing said third photoresist layer, said seed layer and said barrier layer until ULD top surface is reached; removing said third photoresist layer from said composite groove/hole structure; forming metal in said composite groove/hole structure; and chemical-mechanical polishing said metal.

The objects of the invention are accomplished further in a second embodiment where the seed layer and the barrier layer are chemical-mechanical polished without first depositing a third photoresist layer. Copper metal is next selectively formed by electroless plating into the composite the groove/hole structure, and then the excess metal is removed by chemical-mechanical polishing.

BRIEF DESCRIPTION OF THE DRAWINGS

In the drawings that follow, similar numerals are used referring to similar parts throughout the several views.

FIG. 1a shows the removal of excess metal formed over recesses in an insulating layer by chemical-mechanical polishing, according to prior art.

FIG. 1b shows the planarization of the metal and insulating layer of FIG. 1a by chemical-mechanical polishing, according to prior art.

FIG. 1c shows the dishing of metal in recesses of FIG. 1b during the chemical-mechanical polishing of prior art.

FIG. 2a shows the forming of dual damascene structure by the opening of a hole pattern in the semiconductor substrate of this invention.

FIG. 2b shows the forming of dual damascene structure by the opening of a groove pattern in the semiconductor substrate of FIG. 2a of this invention.

DESCRIPTION OF THE PREFERRED EMBODIMENTS

Figure 2C:
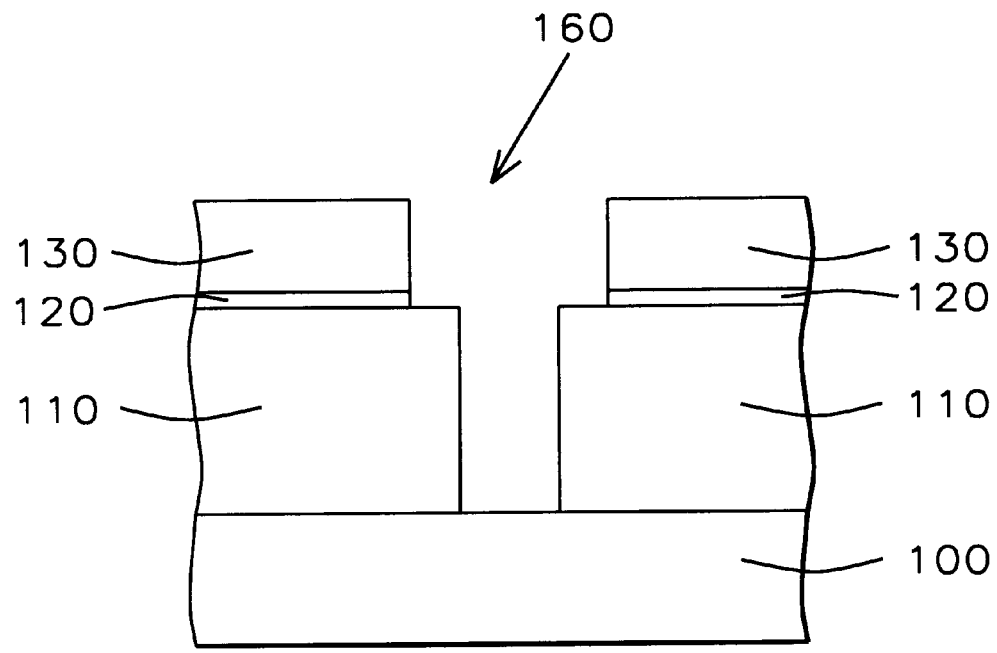
FIG. 2c shows the completed dual damascene structure of this invention.

Referring now the drawings, in particular to FIGS. 2a–2c, and FIGS. 3a–3f, there is shown a method of forming an inlaid, or damascene, copper interconnect with minimized dishing effect after having been subjected to chemical-mechanical polishing. Specifically, FIGS. 2a–2c show the forming of a composite damascene structure of this invention, while FIGS. 3a–3f show the forming of the copper interconnect in the composite structure.

In FIG. 2a, a semiconductor substrate (100), having a substructure of devices and/or metal layer (not shown), is provided. As the substructure is not significant to the invention, it is not described in detail in order not to unnecessarily obscure the present invention.

Two insulating layers of dielectric, namely, a lower layer dielectric (LLD), (110), and an upper layer (ULD), (130), are formed over substrate (100) with an intervening etch-stop layer (120). Usually, a dielectric layer is referred to as an interlevel dielectric (ILD) layer when formed over a semiconductor surface, such as silicon, and as an intermetal dielectric (IMD) layer when formed over a metal layer substructure. The present disclosure provides for copper interconnects reaching either a semiconductor substructure exposed under a contact hole, or a metal substructure under a via hole, and therefore, the more general terms LLD and ULD will be used to distinguish the two layers of dielectric, and the term "hole" to refer to either contact or via holes.

Dielectric layers are known in the art. Both lower (LLD) and upper (ULD) layers shown in FIG. 2a may be formed from materials including but not limited to silicon oxide materials, silicon nitride materials, and silicon oxynitrides materials formed within integrated circuits through methods including but not limited do CVD, PECVD, PVD sputtering methods, and others known as PEOX, PETEOS, or low-k materials, FSG, HSQ Flare and PAE2. For the preferred embodiment of the present invention, LLD layer (110) comprises PECVD oxide having a thickness between about 4000 to 8000 angstroms (Å), while ULD LAYER (130) comprises PECVD oxide with a thickness between about 3000 to 7000 Å.

Etch-stop layer (120) is a thin conformal material which can be silicon nitride ($Si_3N_4$, SiN), silicon oxynitride ($SiO_xN_y$). Silicon nitride is preferred for this embodiment because it has high selectivity to the etchant used in etching the dielectric layers. SiN is formed by reacting dichlorosilane ($SiCl_2H_2$) with ammonia ($NH_3$) in an LPCVD at a temperature between about 300 to 420° C. and at flow rates between about 100 to 500 standard cubic centimeters per minute (sccm), and with a thickness between about 500 to 2000 Å.

After the forming of LLD, ULD and etch-stop layer, a first photoresist layer (140) of a thickness between about 1.0 to 1.2 Å is formed and then patterned with a mask having either a via or contact hole pattern (145), as shown in FIG. 2a. The hole pattern is next etched into the ULD and etch-stop layer (120) as shown in FIG. 2a, forming hole (135) in respective layers (130) and (120). It is preferred that the etching of ULD layer (130) and etch-stop layer (120) is performed with recipe comprising gases CO and $C_2F_6$ at flow rates between about 50 to 100 sccm and 30 to 100 sccm, and modified to etch stop layer (120) with gases $CHF_3$, $C_2F_6$ and Ar at flow rates between about 10 to 30 sccm, 5 to 20 sccm and 50 to 200 sccm, respectively. Subsequent to forming hole pattern (135) in the substrate as shown in FIG. 2a, first photoresist layer (140) is removed by employing oxygen plasma ashing.

Next, a second photoresist layer (150) is formed over the substrate including the previously formed hole pattern (135). The second photoresist layer is patterned with the image of a conductive line using a photomask, and the conductive line pattern is etched into ULD layer, (130), as shown in FIG. (2b) to form conductive line groove (155). At the same time the conductive line groove is formed in ULD layer (130), hole pattern (135) is transferred, by the same etching process, into LLD layer (110). It is preferred that the etching of the lower level dielectric layer is accomplished with recipe comprising gases CO and $C_2F_6$ at flow rates between about 50 to 100 sccm, 20 to 100 sccm, respectively. Thus, a composite hole and groove damascene structure, shown with reference numeral (160) in FIG. 2c, is formed, after which the second photoresist layer is removed.

At the next important step, the walls of composite damascene structure (160), including the bottom wall, are covered with a barrier layer which will later serve as a diffusion barrier to copper. The barrier material is selected from a group consisting of tantalum, tantalum nitride, tungsten nitride and titanium nitride. In this embodiment, tantalum is preferred inasmuch as it has a high dielectric constant and that it can be formed conformally as a thin layer. Tantalum (170) is deposited to a thickness between about 200 to 400 Å. As another important step of the present invention, substrate (100), incorporating the composite structure, is subjected to a process for formation of a seed copper layer (180) on the surface of the barrier layer, tantalum by PVD or CVD methods.

Figure 3A:
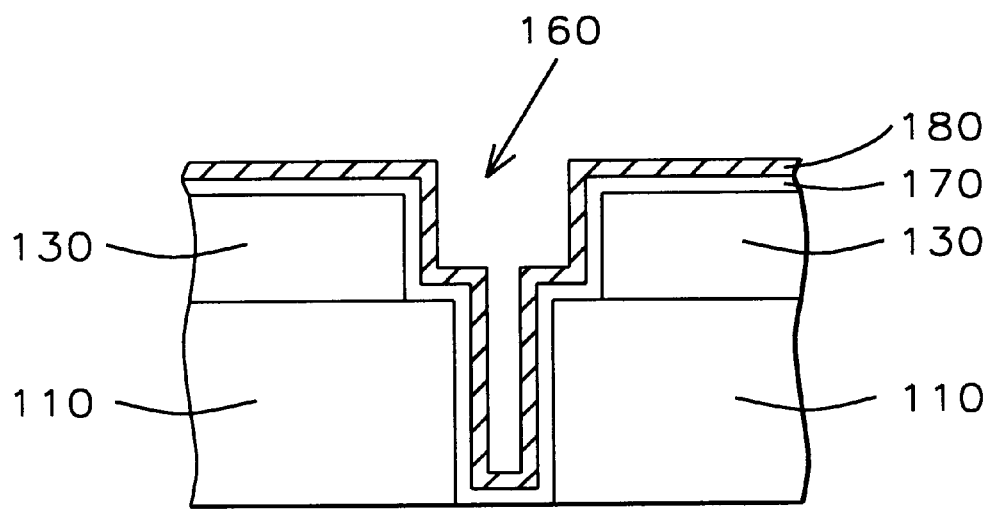
FIG. 3a shows the lining of the dual damascene structure of FIG. 2c with a barrier layer and a copper seed layer.
Figure 3B:
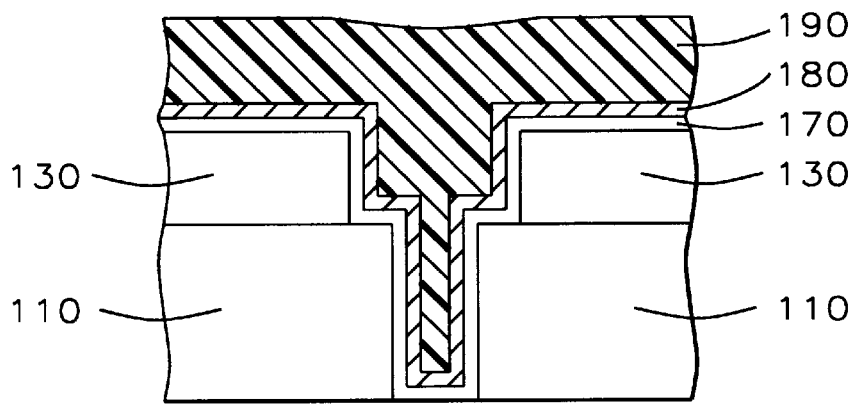
FIG. 3b shows the forming of a photoresist layer over the substrate of FIG. 3a of this invention.
Figure 3C:
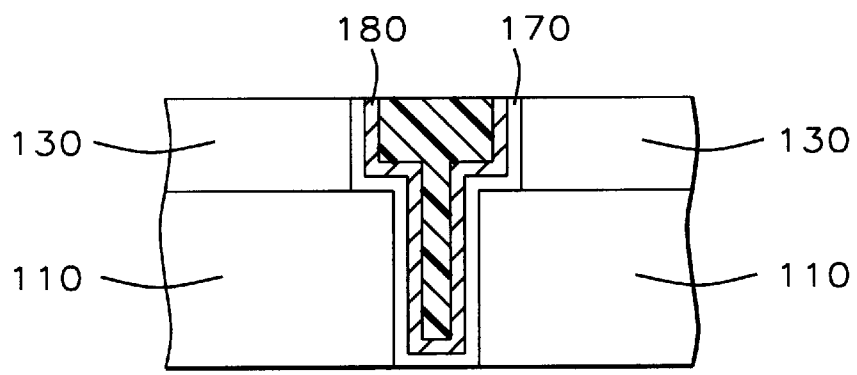
FIG. 3c shows the chemical-mechanical polishing of the photoresist layer, copper seed layer and barrier layer of FIG. 3b of this invention.

After the formation of seed layer (180) over the tantalum surface, (170), a third photoresist layer (190) is formed covering the substrate, filling the composite groove/hole opening (160) as shown in FIG. 3b. In this first preferred embodiment, the photoresist layer serves as a protection against any contaminants entering the opening (160) while removing the seed and the tantalum layers from the surface of the ULD layer (130) by chemical-mechanical polishing in preparation for depositing copper metal in the composite groove/hole structure at the next step. The slurry for removing the photoresist layer and the underlying seed and barrier layers, and at the same time planarizing the ULD layer comprises $Al_2O_3$+deionized water+an additive+$H_2O_2$. After chemical-mechanical polishing, the ULD surface and the photoresist layer in the groove/hole opening are planarized as shown in FIG. 3c, the photoresist in the composite opening is removed by oxygen plasma ashing, resulting in the open structure shown in FIG. 3d.

Figure 3D:
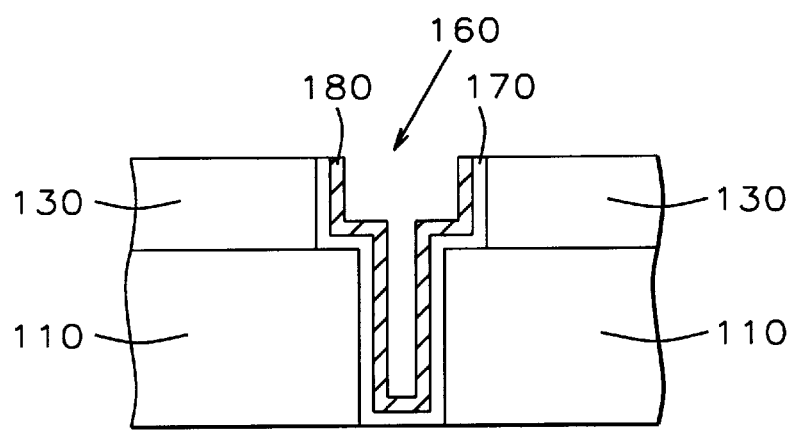
FIG. 3d shows the dual damascene structure of this invention with the barrier layer and the copper seed layer lining the inside walls according to this invention.

In a second embodiment, the step of forming a third photoresist layer is omitted, and the copper seed layer as well as the tantalum layer are removed directly by chemical-mechanical polishing (CMP). Subsequent to the CMP, the composite groove/hole structure is preferably cleaned of any debris caused by the CMP, and the embodiment shown in FIG. 3d is achieved. Preferably, the cleaning recipe comprises deionized water+1% HF+2% NH$_4$OH+mega-sonic additive.

It will be noted in FIG. 3d that both copper seed layer (180) and tantalum barrier (170) on the surface of the ULD layer (130) have been removed, while both layers still lining the inside walls of the composite groove/hole structure. At the next step, which is the main feature and key aspect of the present invention, copper is now deposited over substrate (100) incorporating the composite groove/hole structure, using an electroless deposition process. Electroless plating is accomplished with a solution comprising CuSO$_4$.5H$_2$O+ethylenediaminetietraacetic (EDTA)+surfactant+deionized water. It will be appreciate that electroless plating is insulator-phobic; that is, copper is selectively deposited only on surfaces having the copper seeded layer (180). Consequently, copper metal fills the composite groove/hole structure (160) shown in FIG. 3d and continues building up until a dome-like structure (200) is formed extending above the composite opening as shown in FIG. 3e.

Figure 3E:
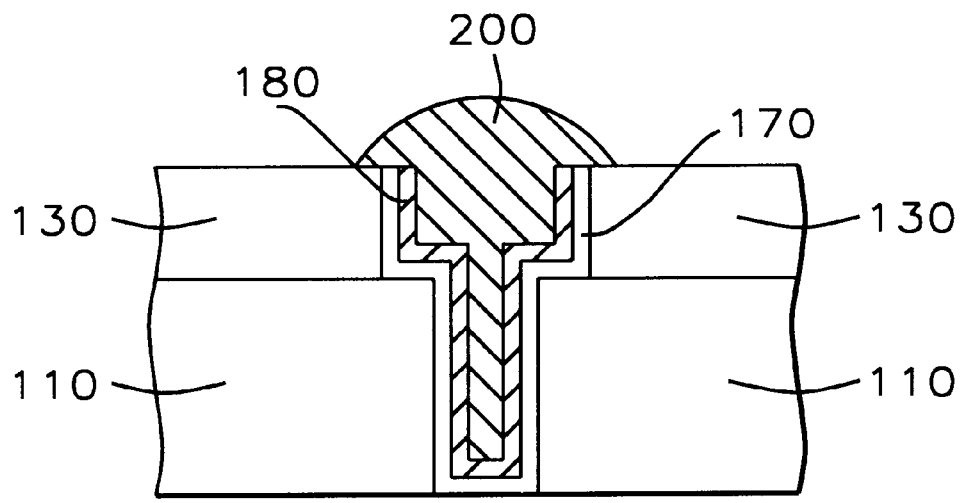
FIG. 3e shows the electroless plating of copper metal into the dual damascene structure of this invention.
Figure 3F:
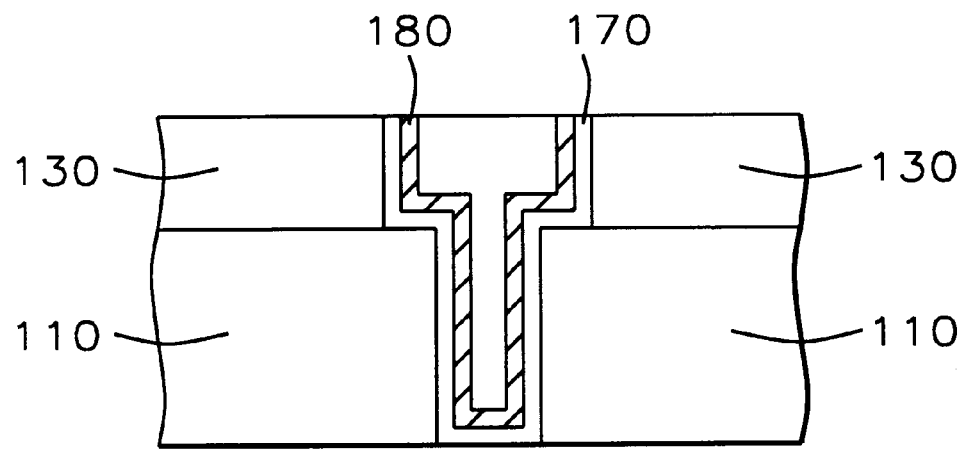
FIG. 3f shows the dual damascene copper interconnect of this invention without any dishing contour in the copper metal after chemical-mechanical polishing, according to this invention.

Still another key feature of the present invention is the chemical-mechanical polishing of the resulting structure of FIG. 3e. A slurry comprising ingredients Al$_2$O$_3$+deionized water+an additive compound+H$_2$O$_2$ at a 9:1 ratio and having a selectivity of 40:1 with respect to the insulator ULD (130) is used. The H$_2$O$_2$ component of the slurry performs the chemical function of converting copper into soft copper so that the action of the polishing pad removes the converted layer quickly. Furthermore, because the dome creates high pressure by virtue of its relatively small area under the polishing pad, and because the removal rate is a linear function of pressure, the mechanical component of the CMP also helps remove the copper dome at an additional rate. When the insulator surface (130) is reached, due to the high selectivity, the pressure on the copper metal is transferred to the surrounding insulating layer, and hence quickly reduced, and the polishing stops. This mechanism then leads to copper interconnects nearly flush with the insulator surface, as shown in FIG. 3f, that is, without any dishing space between the formed interconnect and the subsequent layers of interconnects to be formed similarly.

It will be appreciated by those skilled in the art that the method disclosed in this invention provides several advantages. Firstly, a layer, namely, tantalum, which forms a barrier to copper diffusion in an insulating layer is used as a nucleation surface for seeding with copper atoms. Tantalum has excellent barrier characteristics and can be formed as a very thin conformal lining in the composite damascene structure. By removing the seed and barrier layers from the surface of the insulating layer, and by using selective electroless plating, copper is deposited only where it is needed, namely, in the composite damascene structure. This results in cost-effectiveness. Furthermore, because of the formation of novel dome-like structure over the copper interconnect, and the highly selective slurry used for CMP, the excess copper is quickly removed without dishing effect and well planarized including the surrounding insulator layer. Though these numerous details have been set forth here, such as specific materials, process parameters, etc., in order to provide an understanding of the present invention, exact details need not be employed to practice the present invention. Thus, one may form the composite groove/hole structure by first forming the groove opening and the hole opening. It is also possible to omit the etch-stop layer in the forming of the damascene structure, by using timed-etch when applied with the present invention. One may also choose titanium nitride, TiN, as a barrier material.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of improving chemical-mechanical polishing (CMP) dishing comprising the steps of:

providing a semiconductor substrate having a substructure comprising devices formed in said substrate and a metal layer formed thereon;

forming a lower level dielectric (LLD) layer over said substrate;

forming an etch-stop layer over said LLD layer;

forming an upper level dielectric (ULD) layer over said etch-stop layer;

forming a first photoresist layer over said ULD layer;

patterning said first photoresist layer with a hole pattern;

etching through said hole pattern in said first photoresist layer into said ULD layer;

etching further said hole pattern into said etch-stop layer;

removing said first photoresist layer from said substrate;

forming a second photoresist layer over said substrate including said hole pattern;

patterning said second photoresist layer with a conductive line groove pattern;

etching through said conductive line groove in said second photoresist layer into said ULD layer until etch-stop layer is reached;

etching further and transferring said hole pattern from said ULD layer into said LLD layer until a lower level said substructure of said substrate is reached thus forming a composite groove/hole structure;

removing said second photoresist layer;

forming a barrier layer on the walls, including the bottom wall, of said composite groove/hole structure;

forming a seed layer over said barrier layer;

forming a third photoresist layer over said substrate including said composite groove/hole structure;

chemical-mechanical polishing said third photoresist layer, said seed layer and said barrier layer until ULD top surface is reached;

removing said third photoresist layer from said composite groove/hole structure;

forming metal in said composite groove/hole structure; and chemical-mechanical polishing said metal.

2. The method of claim 1, wherein said LLD layer comprises PECVD oxide.

3. The method of claim 1, wherein said LLD layer has a thickness between about 4000 to 8000 Å.

4. The method of claim 1, wherein said forming an etch-stop layer over said LLD layer is accomplished by reacting dichlorosilane (SiCl$_2$H$_2$) with ammonia (NH$_3$) in an LPCVD at a temperature between about 300 to 420° C.

5. The method of claim 1, wherein said ULD layer comprises PECVD oxide.

6. The method of claim 1, wherein said ULD layer has a thickness between about 3000 to 7000 Å.

7. The method of claim 1, wherein said first photoresist layer over said ULD layer has a thickness between about 1.0 to 1.2 micrometers ($\mu$m).

8. The method of claim 1, wherein said patterning said first photoresist layer is accomplished with a photomask having said hole pattern.

9. The method of claim 1, wherein said etching through said hole pattern in said first photoresist layer into said ULD layer is accomplished with a recipe comprising CO at a flow rate between about 50 to 100 sccm, and $C_2F_6$, at a flow rate between about 30 to 200 sccm.

10. The method of claim 1, wherein said etching further said hole pattern into said etch-stop layer is accomplished with a recipe comprising $CHF_3$, $C_2F_6$, and Ar at flow rates between about 10 to 30 sccm, 5 to 20 sccm and 50 to 200 sccm, respectively.

11. The method of claim 1, wherein said first photoresist layer is removed by oxygen plasma ashing.

12. The method of claim 1, wherein said patterning said second photoresist layer is accomplished with a photomask having said conductive line groove pattern.

13. The method of claim 1, wherein said etching through said conductive line groove in said second photoresist layer into said LLD layer until etch-stop layer is reached is accomplished with a recipe comprising gases CO and $C_2F_6$.

14. The method of claim 1, wherein said etching further and transferring from said ULD layer said hole pattern into said LLD layer until a lower level said substructure of said substrate is reached is accomplished with a recipe comprising CO and $C_2F_6$, at flow rates between about 50 to 100 sccm, and 20 to 100 sccm, respectively.

15. The method of claim 1, wherein said removing said second photoresist layer is accomplished with oxygen plasma ashing.

16. The method of claim 1, wherein said forming a barrier layer on the walls, including the bottom wall, of said composite hole and groove structure is accomplished by depositing tantalum.

17. The method of claim 1, wherein said barrier layer has a thickness between about 200 to 400 Å.

18. The method of claim 1, wherein said forming said seed layer is accomplished by PVD or CVD.

19. The method of claim 1, wherein said seed layer has a thickness between about 1000 to 2000 Å.

20. The method of claim 1, wherein said third photoresist layer has a thickness between about 0.8 to 1.5 μm.

21. The method of claim 1, wherein said chemical-mechanical polishing said third photoresist layer, said seed layer and said barrier layer is accomplished with a slurry comprising $Al_2O_3$+deionized water+an additive compound+$H_2O_2$.

22. The method of claim 1, wherein said removing said third photoresist layer is accomplished by oxygen plasma ashing.

23. The method of claim 1, wherein said forming metal in said composite groove/hole structure over said seed layer covering said barrier layer is accomplished by electrochemical deposition of copper.

24. The method of claim 1, wherein said chemical-mechanical polishing said metal is accomplished with a slurry comprising $Al_2O_3$+deionized water+an additive+$H_2O_2$.

25. A method of improving chemical-mechanical polishing (CMP) dishing comprising the steps of:

provinding a semiconductor substrate having a substructure comprising devices formed in said substrate and a metal layer formed thereon;

forming a lower level dielectric (LLD) layer over said substrate;

forming an etch-stop layer over said LLD layer;

forming an upper level dielectric (ULD) layer over said etch-stop layer;

forming a first photoresist layer over said ULD layer;

patterning said first photoresist layer with a hole pattern;

etching through said hole pattern in said first photoresist layer into said ULD layer;

etching further said hole pattern into said etch-stop layer;

removing said first photoresist layer from said substrate;

forming a second photoresist layer over said substrate including said hole pattern;

patterning said second photoresist layer with a conductive line groove pattern;

etching through said conductive line groove in said second photoresist layer into said ULD layer until etch-stop layer is reached;

etching further and transferring said hole pattern from said ULD layer into said LLD layer until a lower level said substructure of said substrate is reached thus forming a composite groove/hole structure;

removing said second photoresist layer;

forming a barrier layer on the walls, including the bottom wall, of said composite groove/hole structure;

forming a seed layer over said barrier layer;

chemical-mechanical polishing said seed layer and said barrier layer until ULD top surface is reached;

cleaning said composite groove/hole structure;

forming metal in said composite groove/hole structure; and chemical-mechanical polishing said metal.

26. The method of claim 25, wherein said LLD layer comprises PECVD oxide.

27. The method of claim 25, wherein said LLD layer has a thickness between about 4000 to 8000 Å.

28. The method of claim 25, wherein said forming an etch-stop layer over said LLD layer is accomplished by reacting dichlorosilane ($SiCl_2H_2$) with ammonia ($NH_3$) in an LPCVD at a temperature between about 300 to 420° C.

29. The method of claim 25, wherein said ULD layer comprises PECVD oxide.

30. The method of claim 25, wherein said ULD layer has a thickness between about 3000 to 7000 Å.

31. The method of claim 25, wherein said first photoresist layer over said ULD layer has a thickness between about 1.0 to 1.2 micrometers (μm).

32. The method of claim 25, wherein said patterning said first photoresist layer is accomplished with a photomask having said hole pattern.

33. The method of claim 25, wherein said etching through said hole pattern in said first photoresist layer into said ULD layer is accomplished with a recipe comprising CO and $C_2F_6$ at flow rates between about 50 to 100 sccm and 30 to 100 sccm, respectively.

34. The method of claim 25, wherein said etching further said hole pattern into said etch-stop layer is accomplished with a recipe comprising $CHF_3$, $C_2F_6$ and Ar at flow rates between about 10 to 30 sccm, 5 to 20 sccm and 50 to 200 sccm, respectively.

35. The method of claim 25, wherein said first photoresist layer is removed by oxygen plasma ashing.

36. The method of claim 25, wherein said patterning said second photoresist layer is accomplished with a photomask having said conductive line groove pattern.

37. The method of claim 25, wherein said etching through said conductive line groove in said second photoresist layer into said LLD layer until etch-stop layer is reached is accomplished with a recipe comprising gases CO and $C_2F_6$.

38. The method of claim 25, wherein said etching further and transferring from said ULD layer said hole pattern into said LLD layer until a lower level said substructure of said substrate is reached is accomplished with a recipe comprising CO and $C_2F_6$ at flow rates between about 50 to 100 sccm and 20 to 100 sccm, respectively.

39. The method of claim 25, wherein said removing said second photoresist layer is accomplished with oxygen plasma ashing.

40. The method of claim 25, wherein said forming a barrier layer on the walls, including the bottom wall, of said composite hole and trench structure is accomplished by depositing tantalum.

41. The method of claim 25, wherein said barrier layer has a thickness between about 200 to 400 Å.

42. The method of claim 25, wherein said forming said seed layer is accomplished by PVD or CVD.

43. The method of claim 25, wherein said seed layer has a thickness between about 1000 to 2000 Å.

44. The method of claim 25, wherein said chemical-mechanical polishing said seed layer and said barrier layer is accomplished with a slurry comprising $Al_2O_3$+deionized water (DI)+additive+$H_2O_2$.

45. The method of claim 25, wherein said cleaning is accomplished with a recipe comprising DI+1% HF+2% $NH_4O_4$+mega-sonic additive.

46. The method of claim 25, wherein said forming metal in said composite groove/hole structure over said seed layer covering said barrier layer is accomplished by electroless plating of copper.

47. The method of claim 25, wherein said chemical-mechanical polishing said metal is accomplished with a slurry comprising $Al_2O_3$+DI+additive+$H_2O_2$.

* * * * *